(12) United States Patent
Guo et al.

(10) Patent No.: US 12,046,449 B2
(45) Date of Patent: Jul. 23, 2024

(54) METHODS AND APPARATUS FOR PROCESSING A SUBSTRATE

(71) Applicant: Applied Materials, Inc., Santa Clara, CA (US)

(72) Inventors: Yue Guo, Redwood City, CA (US); Katsumasa Kawasaki, Cupertino, CA (US); Kartik Ramaswamy, San Jose, CA (US); Yang Yang, Cupertino, CA (US); Nicolas John Bright, Mountain Lakes, NJ (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 308 days.

(21) Appl. No.: 17/726,930

(22) Filed: Apr. 22, 2022

(65) Prior Publication Data
US 2023/0343555 A1  Oct. 26, 2023

(51) Int. Cl.
 *H01J 37/32* (2006.01)
 *H03H 7/38* (2006.01)
(52) U.S. Cl.
 CPC .. *H01J 37/32146* (2013.01); *H01J 37/32183* (2013.01); *H01J 37/32935* (2013.01); *H03H 7/38* (2013.01); *H01J 2237/24564* (2013.01); *H01J 2237/334* (2013.01)
(58) Field of Classification Search
 None
 See application file for complete search history.

(56) References Cited

U.S. PATENT DOCUMENTS

| | | | |
|---|---|---|---|
| 9,059,680 B2 | 6/2015 | Shimomoto et al. | |
| 10,297,422 B2 | 5/2019 | Sato | |
| 2005/0070123 A1 | 3/2005 | Hirano | |
| 2009/0284156 A1* | 11/2009 | Banna | H01J 37/32155 315/111.21 |
| 2009/0294414 A1* | 12/2009 | Shannon | H01J 37/32935 219/121.54 |

(Continued)

FOREIGN PATENT DOCUMENTS

JP  2015-018766 A  1/2015

OTHER PUBLICATIONS

International Search Report and Written Opinion for PCT/US2022/046214, dated Feb. 7, 2023.

*Primary Examiner* — Allan W. Olsen
(74) *Attorney, Agent, or Firm* — MOSER TABOA (57) ABSTRACT

Methods and apparatus for processing a substrate are provided herein. For example, a matching network configured for use with a plasma processing chamber comprises an input configured to receive one or more radio frequency (RF) signals, an output configured to deliver the one or more RF signals to a processing chamber, a first sensor operably connected to the input and a second sensor operably connected to the output and configured to measure impedance during operation, at least one variable capacitor connected to the first sensor and the second sensor and a controller, based on a measured impedance, configured to tune the at least one variable capacitor of the matching network to a first target position based on weighted output impedance values measured at pulse states of a voltage waveform and to tune the at least one variable capacitor to a second target position based on weighted input impedance values measured at the pulse states of the voltage waveform.

20 Claims, 6 Drawing Sheets

(56) References Cited

U.S. PATENT DOCUMENTS

| | | |
|---|---|---|
| 2015/0122420 A1 | 5/2015 | Konno et al. |
| 2016/0027617 A1 | 1/2016 | Son et al. |
| 2016/0079037 A1* | 3/2016 | Hirano .............. H01J 37/32183 |
| | | 156/345.28 |
| 2016/0126069 A1 | 5/2016 | Kwon et al. |
| 2018/0261430 A1* | 9/2018 | Kawasaki ......... H01J 37/32935 |
| 2019/0355554 A1 | 11/2019 | Ulrich et al. |
| 2020/0075290 A1* | 3/2020 | Kawasaki ......... H01J 37/32146 |

* cited by examiner

METHODS AND APPARATUS FOR PROCESSING A SUBSTRATE

FIELD

Embodiments of the present disclosure generally relate to methods and apparatus for processing substrates, and for example, to methods and apparatus for processing substrates using weighted average tuning in a radio frequency (RF) matching network configured for use with an RF processing chamber.

BACKGROUND

Methods and apparatus for processing substrates in a vacuum processing chamber using one or more of RF power sources are known (e.g., one or more RF power sources can be configured for single level pulsing, dual level pulsing or multi-level pulsing). For example, in single level pulsing (e.g., pulsing between an on state and an off state), there is only one state to tune to (e.g., the on state). In dual level pulsing, however, the RF power source is switched between a high state and a low state (e.g., not an off state). In multi-level pulsing, the RF power source can be switched between multi states.

An RF matching network is often connected between the RF power source and the vacuum processing chamber and configured to ensure that an output of the RF power source is efficiently coupled to the plasma to maximize an amount of energy coupled to the plasma (e.g., referred to as tuning the RF power delivery). For example, in dual level pulsing, there are two or more impedance states that require impedance matching. Current RF matching networks are configured to use motorized capacitors (e.g., in series or shunt) to time average tune to one state and frequency tuning in the other state in real time. Frequency tuning, however, is limited in impedance matching due to single axis tuning, which, in turn, can result in limited process capabilities and increased reflected power. Additionally, plasma load impedance states can vary with pulsing power levels, e.g., bias power on and off, or pulsed voltage waveforms. Motors in an RF match cannot follow the fast-changing impedance states. For example, conventional RF match networks are configured to match to a first state in the multilevel pulsing. With a super-fast pulsing signal or pulsed voltage waveform, e.g., in a microsecond time scale, even frequency tuning may not follow plasma impedance variations and tune well within a pulse cycle.

Thus, the inventors have provided herein improved methods and apparatus for processing substrates using weighted average tuning in a radio frequency (RF) matching network configured for use with an RF processing chamber.

SUMMARY

Methods and apparatus for processing a substrate are provided herein. For example, in some embodiments, a matching network configured for use with a plasma processing chamber comprises an input configured to receive one or more radio frequency (RF) signals, an output configured to deliver the one or more RF signals to a processing chamber, a first sensor operably connected to the input and a second sensor operably connected to the output and configured to measure impedance during operation, at least one variable capacitor connected to the first sensor and the second sensor, and a controller, based on a measured impedance, configured to tune the at least one variable capacitor of the matching network to a first target position based on weighted output impedance values measured at pulse states and to tune the at least one variable capacitor to a second target position based on weighted input impedance values measured at the pulse states.

In accordance with at least some embodiments, a plasma processing chamber comprises a chamber body and a chamber lid, a RF source power connected to the chamber lid and configured to create a plasma from gases disposed in a processing region of the chamber body, one or more RF bias power sources configured to sustain a plasma discharge, and a matching network comprising an input configured to receive one or more radio frequency (RF) signals, an output configured to deliver the one or more RF signals to a processing chamber, a first sensor operably connected to the input and a second sensor operably connected to the output and configured to measure impedance during operation, at least one variable capacitor connected to the first sensor and the second sensor, and a controller, based on a measured impedance, configured to tune the at least one variable capacitor of the matching network to a first target position based on weighted output impedance values measured at pulse states and to tune the at least one variable capacitor to a second target position based on weighted input impedance values measured at the pulse states.

In accordance with at least some embodiments, a method for processing a substrate comprises measuring impedance at an input of a matching network configured to receive one or more radio frequency (rf) signals and an output of the matching network configured to deliver the one or more rf signals to a processing chamber and based on the measured impedance tuning at least one variable capacitor of the matching network to a first target position based on weighted output impedance values measured at pulse states and tuning the at least one variable capacitor to a second target position based on weighted input impedance values measured at the pulse states.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus for processing a substrate are provided herein. For example, a matching network configured for use with a plasma processing chamber can comprise an input configured to receive one or more radio frequency (RF) signals and an output can be configured to deliver the one or more RF signals to a processing chamber. A first sensor can be operably connected to the input and a second sensor can be operably connected to the output and configured to measure impedance during operation. At least one variable capacitor can be connected to the first sensor and the second sensor. A controller, based on a measured impedance, can be configured to tune the at least one variable capacitor of the matching network to a first target position based on weighted output impedance values measured at pulse states and to tune the at least one variable capacitor to a second target position based on weighted input impedance values measured at the pulse states. Advantages of the apparatus and methods described herein include, but are not limited to, tuning to an optimized weighted plasma impedance value to achieve minimum total reflected power for all states during multilevel pulsing, spatial power distribution and uniformity, and flexibility to define tuning targets based on different process and pulsing conditions.

Figure 1:
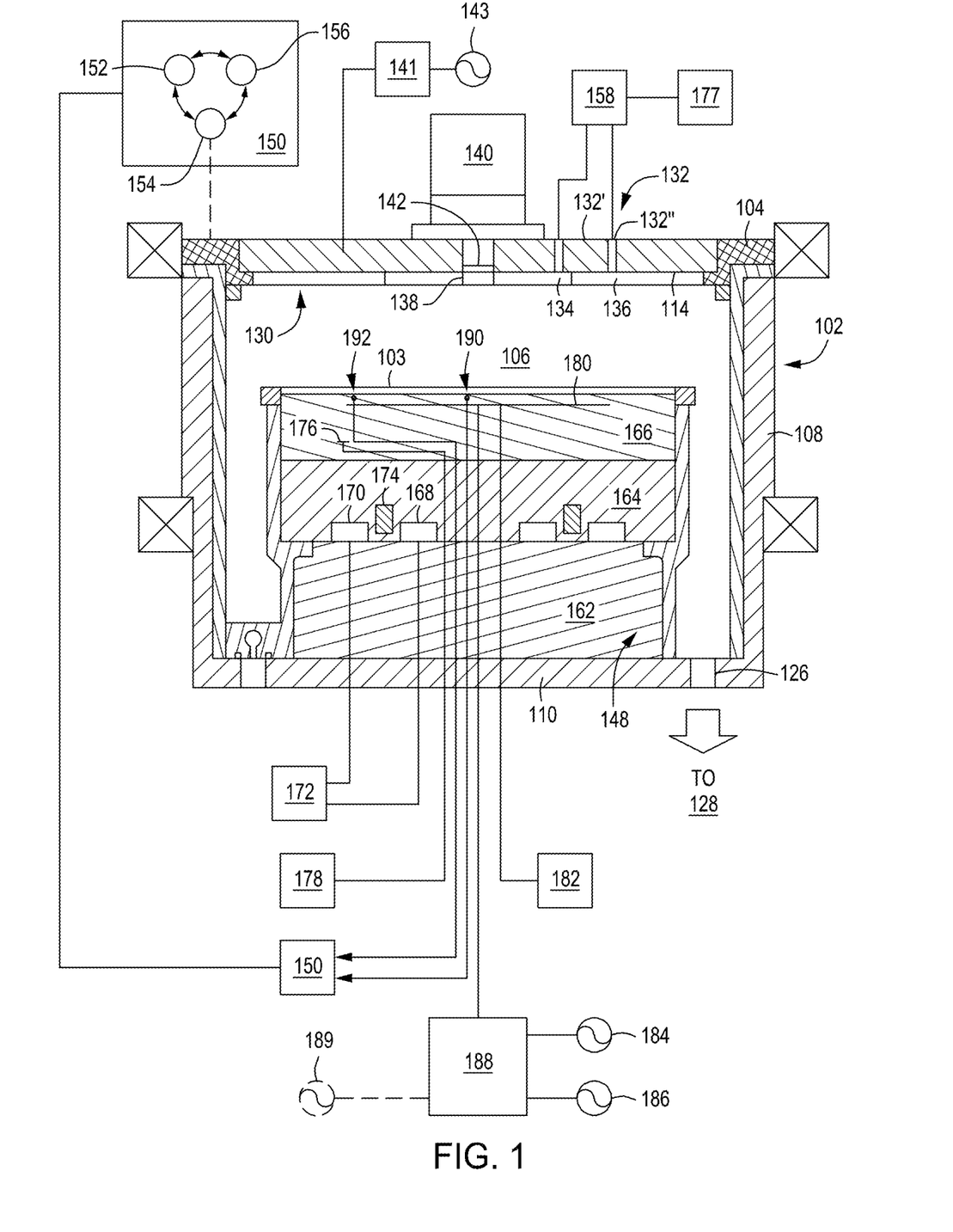
FIG. 1 is a cross-sectional view of processing chamber in accordance with at least some embodiments of the present disclosure.

FIG. 1 is a sectional view of one example of a processing chamber 100 suitable for performing an etch process in accordance with the present disclosure. Suitable processing chambers that may be adapted for use with the teachings disclosed herein include, for example, one or more etch processing chambers available from Applied Materials, Inc. of Santa Clara, CA. Other processing chambers may be adapted to benefit from one or more of the methods of the present disclosure.

The processing chamber 100 includes a chamber body 102 and a chamber lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In embodiments, the pump system 128 maintains the pressure inside the interior volume 106 at operating pressures typically between about 1 mTorr to about 500 mTorr, between about 5 mTorr to about 100 mTorr, or between about 5 mTorr to 50 mTorr depending upon process needs.

In embodiments, the chamber lid 104 is sealingly supported on the sidewall 108 of the chamber body 102. The chamber lid 104 may be opened to allow excess to the interior volume 106 of the processing chamber 100. The chamber lid 104 includes a window 142 that facilitates optical process monitoring. In one embodiment, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one embodiment, the optical monitoring system 140 is coupled to the chamber lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed.

Process gases and/or cleaning gases can be introduced to the interior volume 106 of the chamber body 102 through the showerhead assembly 130 from a gas panel 158, which is coupled to the processing chamber 100. A vacuum pump system such as pump system 128 maintains the pressure inside the chamber body 102 while removing deposition by-products.

In embodiments, the gas panel 158. In the example depicted in FIG. 1, inlet ports 132', 132" are provided in the chamber lid 104 to allow gases to be delivered from the gas panel 158 to the interior volume 106 of the processing chamber 100. In embodiments, the gas panel 158 is adapted to provide oxygen and inert gas such as argon, or oxygen and helium process gas or gas mixture through the inlet ports 132', 132" and into the interior volume 106 of the processing chamber 100. In one embodiment, the process gas provided from the gas panel 158 includes at least a process gas including an oxidizing agent such as oxygen gas. In embodiments, the process gas including an oxidizing agent may further comprise an inert gas such as argon or helium. In some embodiments, the process gas includes a reducing agent such as hydrogen and may be mixed with an inert gas such as argon, or other gases such as nitrogen or helium. In some embodiments, a chlorine gas may be provided alone, or in combination with at least one of nitrogen, helium an inert gas such as argon. Non-limiting examples of oxygen containing gas includes one or more of $O_2$, $CO_2$, $N_2O$, $NO_2$, $O_3$, $H_2O$, and the like. Non-limiting examples of nitrogen containing gas includes $N_2$, $NH_3$, and the like. Non-limiting examples of chlorine containing gas includes HCl, $Cl_2$, $CCl_4$, and the like. In embodiments, a showerhead assembly 130 is coupled to an interior surface 114 of the chamber lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

In some embodiments, the processing chamber 100 may utilize capacitively coupled RF energy for plasma processing, or in some embodiments, processing chamber 100 may use inductively coupled RF energy for plasma processing. In some embodiments, a remote plasma source 177 may be optionally coupled to the gas panel 158 to facilitate dissociating gas mixture from a remote plasma prior to entering the interior volume 106 for processing. In some embodiments, a RF source power 143 is coupled through a matching network 141 to the showerhead assembly 130. The RF source power 143 typically can produce up to about 5000 W for example between about 200 W to about 5000 W, or between 1000 W to 3000 W, or about 1500 W and optionally at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the chamber lid 104.

The showerhead assembly 130 can be configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through inlet ports 132', 132".

The substrate support pedestal assembly 148 is disposed in the interior volume 106 of the processing chamber 100 below the gas distribution assembly such as showerhead assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

The substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises an electrode 180 (e.g., a clamping electrode) for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum, or gravity.

A base 164 or electrostatic chuck 166 may include a heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further include a plurality of gas passages (not shown), such as grooves, that are formed in a substrate support pedestal supporting surface of the electrostatic chuck 166 and fluidly coupled to a source of a heat transfer (or backside) gas, such as helium (He). In operation, the backside gas is provided at controlled pressure into the gas passages to enhance the heat transfer between the electrostatic chuck 166 and the substrate 103. In embodiments, the temperature of the substrate may be maintained at 20 degrees Celsius to 450 degrees Celsius, such as 100 degrees Celsius to 300 degrees Celsius, or 150 degrees Celsius to 250 degrees Celsius.

The substrate support pedestal assembly 148 can be configured as a cathode assembly and includes an electrode 180 that is coupled to a plurality of RF bias power sources 184, 186. The RF bias power sources 184, 186 are coupled between the electrode 180 disposed in the substrate support pedestal assembly 148 and another electrode, such as the showerhead assembly 130 (or the chamber lid 104) of the chamber body 102. The RF bias power excites and sustains a plasma discharge formed from the gases disposed in the processing region of the chamber body 102.

Still referring to FIG. 1, in some embodiments the dual RF bias power sources 184, 186 are coupled to the electrode 180 disposed in the substrate support pedestal assembly 148 through a matching network 188. The signal generated by the RF bias power sources 184, 186 is delivered through matching network 188 to the substrate support pedestal assembly 148 through a single feed to ionize the gas mixture provided in the plasma processing chamber such as processing chamber 100, thus providing ion energy necessary for performing an etch deposition or other plasma enhanced process. The RF bias power source 184, 186 are generally capable of producing an RF signal having a frequency of from about 50 kHz to about 200 MHz (e.g., about 13.56 MHz+/−5%) and a power between about 0 Watts and about 10,000 Watts (e.g., from about 50 W for low-power operation to about 10,000 W for high-power operation), 1 Watt (W) to about 100 W, or about 1 W to about 30 W. An additional bias power may be coupled to the electrode 180 to control the characteristics of the plasma.

In at least some embodiments, impedances at an Input port and an output port of the matching network 188 and/or the matching network 141 can be measured at all states in a multilevel pulsing. The impedances at the Input port and the output port the matching networks can be used to determine weighted input and output impedances for tuning. For example, apparatus and methods described herein use weighted average tuning in multilevel pulsing. In at least some embodiments, a weighted combination of measured output impedances can be selected for feedforward tuning, and a weighted impedance can be defined from measured input impedances at multilevel pulsing states. Additionally, in at least some embodiments, frequency tuning can used in conjunction with the weighted average tuning for a hybrid tuning. The matching networks described herein can receive a TTL synchronization signal from an RF generator and/or an advanced waveform generator 202, as described in greater detail below. Alternatively or additionally, the matching networks can receive a TTL synchronization signal that is trigged internally with detected pulse rising edges.

A controller 150 is coupled to the processing chamber 100 to control operation of the processing chamber 100. The controller 150 includes a central processing unit 152, a memory 154, and a support circuit 156 utilized to control the process sequence and regulate the gas flows from the gas panel 158. The central processing unit 152 may be any form of general-purpose computer processor that may be used in an industrial setting. The software routines can be stored in the memory 154, such as random-access memory, read only memory, floppy, or hard disk drive, or other form of digital storage. The support circuit 156 is conventionally coupled to the central processing unit 152 and may include cache, clock circuits, input/output systems, power supplies, and the like. Bi-directional communications between the controller 150 and the various components of the processing chamber 100 are handled through numerous signal cables.

Figure 2:
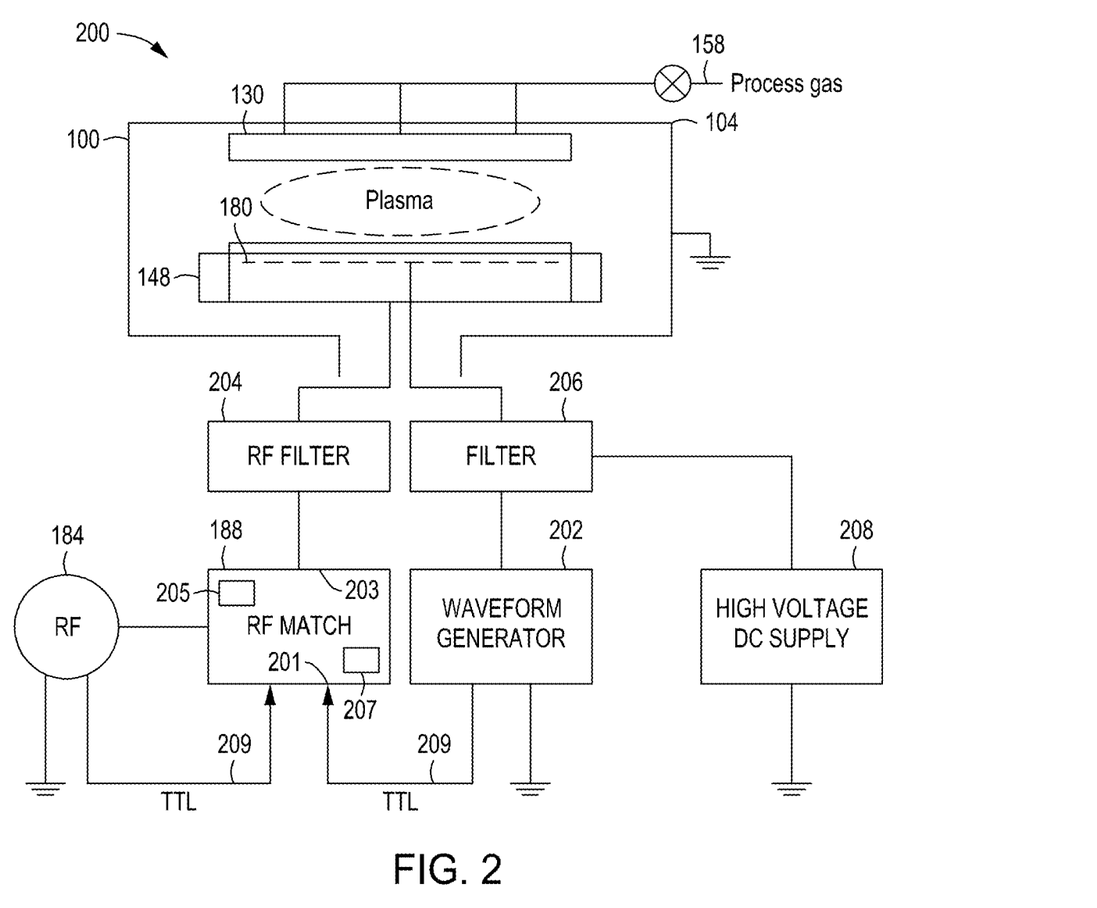
FIG. 2 is a diagram of a system in accordance with at least some embodiments of the present disclosure.

FIG. 2 is a diagram of a system 200, in accordance with at least some embodiments of the present disclosure.

For example, in at least some embodiments, one or more RF power supplies (e.g., the RF bias power source 184 and/or the RF source power 143) can be configured to provide RF power for plasma production to an RF baseplate (e.g., electrostatic chuck 166) of the cathode assembly. In such embodiments, the top electrodes (e.g., the showerhead assembly 130 (or the chamber lid 104)) can be grounded. A frequency of the one or more RF power supplies can be from 13.56 MHz to very high frequency band such as 60 MHz, 120 MHz or 162 MHz. In at least some embodiments, the one or more RF power supplies can also be delivered through the top electrodes. The one or more RF power supplies can be operated in a continuous mode or a pulsed mode. For example, in the pulsed mode, a pulsing frequency can be 100 Hz to about 10 kHz and a duty cycle can be from about 5% to about 95%.

An RF impedance matching network e.g., the matching network 188 and/or the matching network 141)) is connected between the one or more RF power supplies and the processing chamber 100 to optimize power delivery efficiency. The matching network is configured for use with a plasma processing chamber, e.g., a physical vapor deposition chamber, chemical vapor deposition chamber, atomic layer deposition, etch chamber, or other processing chamber that uses a matching network. For illustrative purposes, the matching network (e.g., the matching network 141 and/or the matching network 188) is described herein with respect to an etch chamber, e.g., the processing chamber 100.

The matching network includes an input stage 201 configured to connect to the one or more RF power supplies (e.g., RF bias power sources 184, 186) of a plasma processing chamber and configured to receive one or more radio frequency (RF) signals. The matching network also includes an output stage 203 configured to connect to a substrate support pedestal assembly (e.g., the substrate support pedestal assembly 148) of the processing chamber and configured to deliver the one or more RF signals to a processing chamber.

The matching network includes one or more variable (tunable) capacitors, such as a first variable capacitor 205 (e.g., as series variable capacitor) and a second variable capacitor 207 (e.g., a shunt variable capacitor), which can be connected serially or parallelly to each other. The first variable capacitor 205 and the second variable capacitor 207 have variable capacitances that allow the first variable capacitor 205 and the second variable capacitor 207 to be tuned to one or frequencies. For example, in at least some embodiments, the first variable capacitor 205 and the second variable capacitor 207 can have a capacitance of about 3p F to about 2500 pF. In at least some embodiments, such as when a processing chamber is operating in a high-power state or low-power state, the first variable capacitor 205 and the second variable capacitor 207 can be tuned to one or more of the above described frequencies, e.g., a target frequency +−10% and a target frequency from 100 kHz to about 250 MHz.

In at least some embodiments, one or more additional capacitors, inductors, transistors, etc. (not shown) can also be provided and connected in parallel and/or series with the first variable capacitor 205 and the second variable capacitor 207

The first variable capacitor 205 and the second variable capacitor 207 can be the same as each other or different from each other. In at least some embodiments, the first variable capacitor 205 can be coupled to the output stage 203 and the second variable capacitor 207 can be connected to the input stage 201, or vice versa.

In at least some embodiments, one or more RF filters can be connected to the matching network to allow powers in a selected frequency range, and to isolate RF power sources from each other. For example, in at least some embodiments, an RF filter 204 is connected to the matching network 188 and to the substrate support pedestal assembly 148.

In at least some embodiments, an advanced waveform generator 202 can used to supply one or more waveforms (e.g., a pulsed voltage waveform and/or a tailored voltage waveform, which can be a sum of harmonic frequencies associated with the tailored voltage waveform). The one or more voltage waveforms can be coupled to a bias electrode (e.g., the electrode 180 of the substrate support pedestal assembly 148) through one or more filter assemblies. For example, in at least some embodiments, an RF filter 206 is connected to the advanced waveform generator 202 and to the electrode 180. The advanced waveform generator 202 can output a synchronization signal to the matching network 188. For example, in at least some embodiments, the synchronization signal can be a transistor-transistor logic (TTL) 209 signal, as described in greater detail below. Alternatively or additionally, the RF source power can be configured to output a synchronization signal to the matching network 188. Alternatively or additionally, the matching network can be configured to generate an internal synchronization signal, as described in greater detail below.

Figure 3:
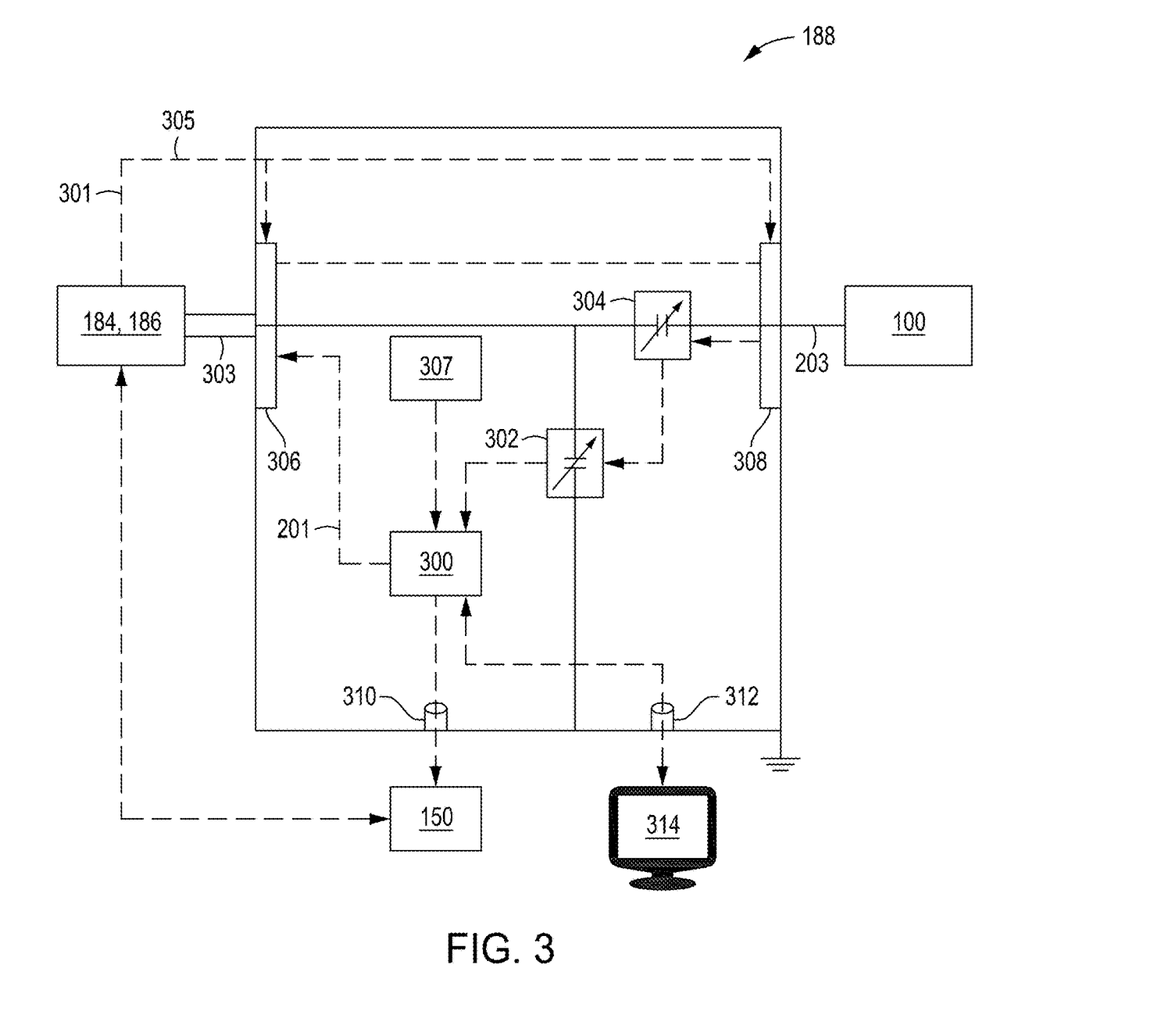
FIG. 3 is diagram of a matching network in accordance with at least some embodiments of the present disclosure.

FIG. 3 is a diagram of the matching network 188 configured for use with the processing chamber 100, in accordance with at least some embodiments of the present disclosure. In at least some embodiments, the matching network 188 can be an L type or Pi type matching network.

The matching network 188 comprises a local controller, one or more sensors, and one or more motorized capacitors all of which are connected via EtherCAT (illustrated by the dashed lines 301). EtherCAT is a real time industrial Ethernet protocol, and due to short cycle time and low jitter, EtherCAT provides high speed and accurate synchronization during plasma processing. One or more other interfaces can be used to connect the components of the matching network 188 to each other and/or an RF generator and a plasma processing chamber to the matching network 188. For example, a transmission line 303 (illustrated by the solid lines) can be used to connect an RF generator to the matching network 188 and the matching network 188 to the plasma processing chamber, e.g., in order to supply RF power to the plasma processing chamber.

In at least some embodiments, a local controller 300 functions as a local EtherCAT master, and all matching network components, e.g., sensors, motorized capacitors, are EtherCAT slave devices, which are controlled by the local controller 300. For example, a command sent by the local controller 300 (e.g., EtherCAT master controller) passes to all EtherCAT slave devices. A first motorized capacitor 302 (vacuum capacitor) with EtherCAT interface can be connected to the local controller 300 and to a second motorized capacitor 304 (vacuum capacitor) with EtherCAT interface. The first motorized capacitor 302 can be connected to the second motorized capacitor 304 in a serial or parallel configuration. For example, in the illustrated embodiment, the first motorized capacitor 302 (e.g., a shunt variable capacitor) is connected in parallel with the second motorized capacitor 304 e.g., a series variable capacitor). The first motorized capacitor 302 and the second motorized capacitor 304 are motorized variable capacitors and are configured to be adjusted during operation. For example, the local controller 300 can be configured to adjust the first motorized capacitor 302 and the second motorized capacitor 304 to minimize reflected power during plasma processing.

The local controller 300 can be connected (directly or indirectly) to a first sensor 306 disposed at an input of the matching network 188 and a second sensor 308 (when used) disposed at an output of the matching network 188 for obtaining in-line RF voltage, current, phase, harmonics, and impedance data, respectively. In at least some embodiments, the first sensor 306 and the second sensor 308 can be multi-frequency voltage/current probes. The measured data can be used for automatic impedance tuning, load impedance monitoring, etc.

In at least some embodiments, an interlock circuitry 307 can be connected to the local controller 300 and configured prevent RF generator failure. For example, the interlock circuitry 307 can comprise fault protection circuitries that are configured to shut down RF power output from an RF generator when reflected RF power exceeds a certain percentage of forward power (e.g., >20%), which is RF power sent by an RF generator through the matching network 188 to the load, e.g., plasma in a processing chamber.

As noted above, EtherCAT communication interface connects the local controller 300 to the first motorized capacitor 302, the second motorized capacitor 304, the first sensor 306, and the second sensor 308. The EtherCAT communication interface directly connects an RF generator (e.g., RF bias power sources 184, 186 (and/or bias power 189)) to each of the first sensor 306 and the second sensor 308 for transmitting a TTL signal 305 from the RF generator to each of the first sensor 306 and the second sensor 308, e.g., for fast response and short tune time.

In at least some embodiments, when connected to an RF generator and to a plasma processing chamber, the local controller 300 is configured as an EtherCAT master device, which controls and monitors local EtherCAT slave devices, such as sensors and stepper motors. The local controller 300 is also integrated with an EtherCAT slave controller, so that the local controller 300 can act as an EtherCAT slave device and the controller 150 works as an EtherCAT master device. That is, the local controller 300 is configured to perform a master to slave conversion with the controller 150. The tool controller can be implemented on an industrial computer and embedded with required drivers. In such embodiments, the local controller 300 can receive feedback requests from the controller 150 and provide feedback thereto during plasma processing. For example, the local controller 300 can receive in-line RF voltage, current, phase, harmonics, and impedance data obtained via the first sensor 306 and the second sensor 308. Sensor data and variable capacitor positions can be transmitted to the controller 150, and combined with other system processing data, such as forward and reflected power data from the RF bias power source 184 and the RF bias power source 186, thus creating cooperative intelligent real time control during operation.

The matching network 188 can comprise at least one of a first network port 310, (e.g., a dual RJ45 type port) configured to connect to the controller 150 and a second serial port configured to connect to an external computing device for manual control of the matching network 188 (e.g., laptop or other suitable computing device). For example, in at least some embodiments, the controller 150 can connect to a first network port 310 of the matching network 188 for plasma process control. The local controller 300 can receive in-line RF voltage, current, phase, harmonics, and impedance data obtained via the first sensor 306 and the second sensor 308. Sensor data and variable capacitor positions can be transmitted to the controller 150, and combined with other system processing data, such as forward and reflected power data from the RF bias power source 184 and the RF bias power source 186, thus creating cooperative intelligent real time control during operation. In at least some embodiments, the matching network 188 can include a second serial port 312 that is configured to connect to a computing device 314 for algorithm uploading and for manual control of the matching network, e.g., by using an external software and application programming interface (API). In at least some embodiments, the external software and API can be uploaded and stored the memory 154 and accessed by the controller 150 and/or in a memory (not shown) of the local controller 300. In at least some embodiments, sensor data, which can be obtained from the first sensor 306 and the second sensor 308, can be accessed from the computing device 314. Additionally, when connected to the second serial port 312, the computing device 314 can be configured to control the first motorized capacitor 302 and the second motorized capacitor 304. Providing the first network port 310 and the second serial port 312 provides the matching network 188 with great flexibility when compared to conventional matching networks. For example, advanced process related control algorithms can be deployed in real time and the matching network 188 can operate fully autonomously, cooperatively with the controller 150 and/or manually controlled via the computing device 314. During processing, if needed, the EtherCAT based distributed RF impedance matching networks described herein allows a user using a computing device 314 to fully control the matching network 188 and components associated therewith.

Figure 4:
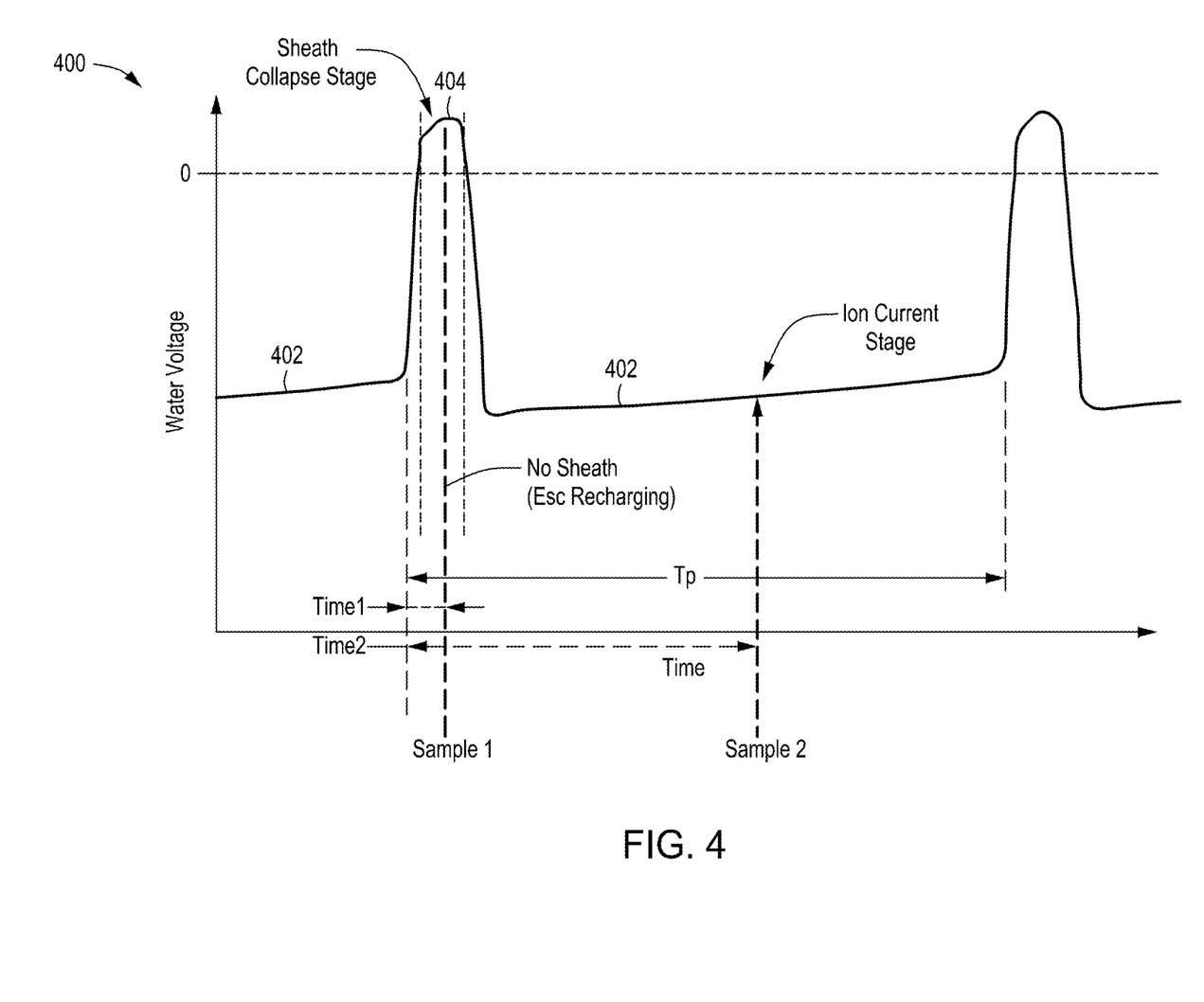
FIG. 4 is a graph of sampling impedances in accordance with at least some embodiments of the present disclosure.

FIG. 4 is a graph 400 of sampling impedances in accordance with at least some embodiments of the present disclosure. For example, in at least some embodiments, voltage waveforms or RF power pulses applied at a substrate (e.g., the substrate 103) within the processing chamber 100 can include two stages. Plasma sheath impedance varies with supplied pulsed voltage waveforms and RF power pulses, and the matching network 188 monitors a TTL synchronization signal from the waveform generator 202 or an RF power supply. For example, in a pulse cycle, two or more pulsed data points can be collected by the matching network 188 to collect impedances at different stages. In at least some embodiments, a first data sample can be collected at a $1^{st}$ stage for impedance $Z_1$ (e.g., at 404, which can correspond to a sheath collapse stage) and a second data sample can be collected at a $2^{nd}$ stage for impedance $Z_2$ (e.g., at 402, which can correspond to ion current stage). The collected data samples can be used to obtain weighted impedance values. In at least some embodiments, data samples need to be collected after a time delay, which is defined based on, for example, a pulsing frequency, a duty cycle, and/or a rising edge of the TTL synchronization signal.

In at least some embodiments, a high voltage DC supply 208 can be used to supply power to the electrode 180 to chuck the substrate (e.g., a wafer) during processing for thermal control. In at least some embodiments, a third electrode (not shown) can be provided at an edge of the cathode assembly for edge uniformity control. In such embodiments, a third low frequency RF power supply in the frequency range of 50 kHz to 2 MHz can be delivered to the edge electrode and run at a continuous mode.

Figure 5:
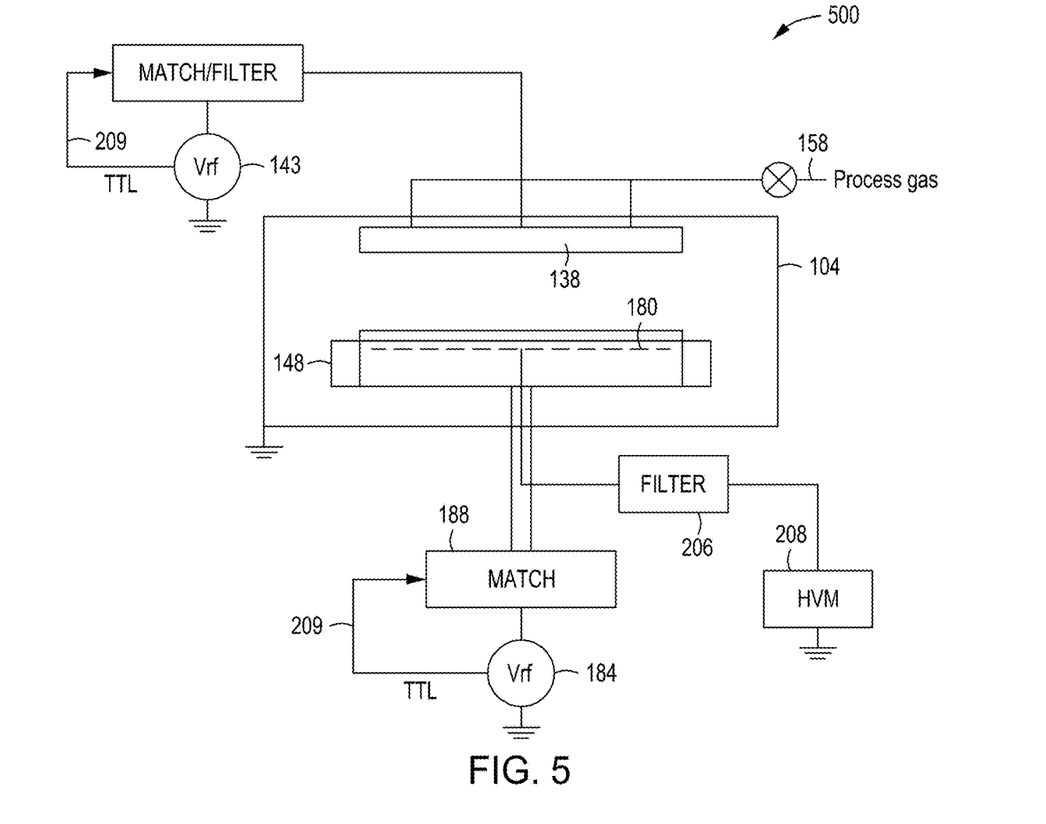
FIG. 5 is a diagram of a system in accordance with at least some embodiments of the present disclosure.

FIG. 5 is a diagram of a system 500 in accordance with at least some embodiments of the present disclosure. The system 500 is substantially identical to the system 200. Accordingly, only those features that are unique to the system 500 are described herein.

For example, one or more RF power supplies (e.g., the RF source power 143) is connected to a top electrode for plasma production. The frequency of the one or more RF power supplies can operate in a frequency from about 13.56 MHz to about 200 MHz, such as 60 MHz, 120 MHz or 162 MHz as needed. The one or more RF power supplies can be operated in a continuous or a pulsed mode. The pulsing frequency can be from 100 Hz to 10 kHz and the duty cycles can be from about 5% to about 95%. An RF bias power (e.g., the RF bias power source 184) is connected to the bottom electrode with a frequency range from about 100 kHz to about 15 MHz. The RF bias power can be operated in either a continuous or a pulsed mode. The pulsing frequency can be from 100 Hz to 10 kHz and the duty cycles can be from about 5% to about 95%. One or both of the RF source power 143 and the RF bias power can be configured to send a synchronization TTL signal to the matching network 141 and the matching network 188, respectively. As noted above, a third electrode can be used at an edge of the cathode assembly for edge uniformity control. In such embodiments, a third low frequency RF power supply in the frequency range of 50 kHz to 2 MHz can be delivered to the edge electrode and run at a continuous mode. Similar to the system 200, RF filters can be connected to the matching network 188 (not shown), connected to the matching network 141 and the high voltage DC supply 208. In at least some embodiments, an RF filter can be connected to the matching network 188.

Figure 6:
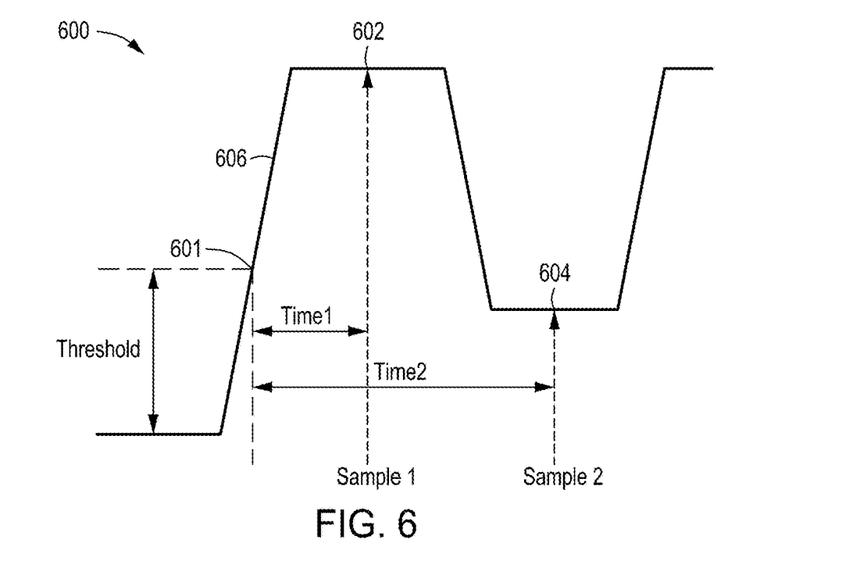
FIG. 6 is a diagram of internal synchronization for dual level pulsing in accordance with at least some embodiments of the present disclosure.

FIG. 6 is a diagram 600 of internal synchronization for dual level pulsing, in accordance with at least some embodiments of the present disclosure. For example, as described above, to obtain impedance values for determining a weighted average, a trigger signal can be generated externally (e.g., via the one or more RF power supplies or an advanced waveform generator) or internally (e.g., via the matching networks). In the latter embodiment, voltage and current sensors (e.g., a first sensor 306 and a second sensor 308) of the matching network are configured to detect a start of pulse signal internally. The voltage and current sensors can sense multiple impedance samples during a pulse cycle. For example, at a first sample time and at a second sample time that are defined relative to a start of the trigger signal, typically the rising edge of the pulse. Multiple impedances can be measured in the same pulse level or different levels and can be used in a weighted average tuning algorithm. Accordingly, the matching networks use a weighted impedance from all measured samples in the same pulse level or different levels.

The collected data samples can be measured in a pulse or averaged from multiple pules, e.g., a threshold value 601 can be defined for pulse detection. The threshold value 601 can be set between two pulse state levels. A start of pulses is detected when voltages measured by sensor (not shown) go above the threshold value 601. In at least some embodiments, a sample 1 and a sample 2 can be taken from different pulses. In at least some embodiments, a sample 1 and a sample 2 can be an average of many pulsed data points collected from multiple pulses. For example, in at least some embodiments to calculate averaged values, pulse high states can be measures ten times in ten pulses to get an averaged sample 1, and pulse low states can be measured ten times in the same or different ten pulses to get an averaged sample 2.

Data point measurements are triggered after a delay of a first sample time and a second sample time relative to the start of the pulse. The first sample time and the second sample time determine when measurements are taken in the pulse.

For example, a first data sample 602 and a second data sample 604 can be collected at a high state and a low state, respectively, by defining the first pulse time and the second pulse time with respect to a trigger signal, for example, a rising edge 606 of the pulse.

The inventors have found that plasma load impedance can vary with multilevel pulse states due to different power levels or mixes of RF power supplies (e.g., the RF bias power source 184 and the RF source power 143). Additionally, vacuum capacitor motors, which are, typically, used in conventional matching networks, cannot respond quickly enough (e.g., move) in a pulse cycle, conventional matching networks are not capable of tuning to both impedances at the same time.

Thus, the inventors have provided a weighted combination of impedances (e.g., various impedance samples obtained either via external or internal triggers) for single or multi-level pulsing. For example, in a dual level pulsing, using one or both of the external or internal triggers, a first impedance $Z_1$ can be measured at a first sample time at a first pulse level, and a second impedance $Z_2$ can be measured at a second sample time at a second pulse level. A weighted target impedance can then be calculated using the Equation (1):

$$Z_w = *w + Z_2*(1-w), w \text{ from 0 to 1} \ldots, \quad (1)$$

where w is a weight value between 0 and 1. In at least some embodiments, a multistate weighting algorithm can also be used, where more weight values may be needed. For example, w1 and w2 can be weight values in a triple level pulsing situation. In operation, the weighted target impedance of the matching networks described herein change with weight values during dual impedance states. For example, when w is equal to zero, the matching networks tune to an impedance equal to a second level in the pulse, whereas the matching networks tune to an impedance equal to a first level when w is equal to one.

In at least some embodiments, an optimized w value can be determined based on minimum total reflected power for both states. For example, using reflected power changes with a weight value in a dual level pulsing. For example, a first level can have a minimum reflected power at w=1, and a second level can have minimum one at w=0. For example, when w=0.8, total reflected power for both states is at the minimum. Other criteria can also be used for selecting an appropriate weight value.

Similarly, the matching networks provide measured and weighted output impedances in a dual level pulsing. For example, a plasma load impedance can vary with pulsing power levels, bias power on and off, or pulsed voltage waveforms. Accordingly, $Z_1$ and $Z_2$ can be measured impedances at an output of the matching networks, again with either external or internal synchronization. As noted above, since motors in conventional matching networks are not capable of follow the fast-changing impedance states, a weighted output impedance can be calculated and used as a target plasma load impedance. For example, in at least some embodiments, a weighted impedance at the output of the matching network can be used in a feedforward tuning algorithm as a tuning goal.

In at least some embodiments, the weighted input impedance and weighted output impedance can be stored in a look-up table (e.g., in the memory 154) or a circuit model can be used to move variable capacitors inside the RF match directly to target positions. In some embodiments, learning based tuning algorithm can be adopted to find a proper weighted target impedance at the RF match input and/or output.

Figure 7:
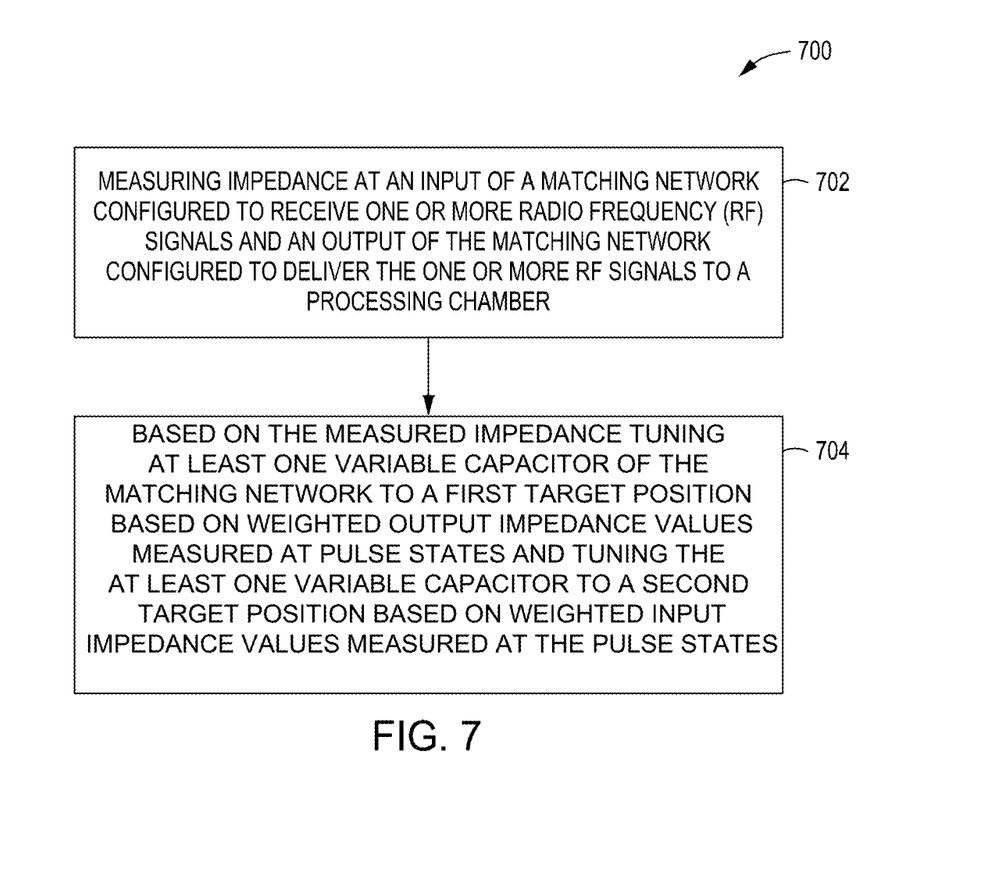
FIG. 7 is a flowchart of a method of processing a substrate in accordance with at least some embodiments of the present disclosure.

FIG. 7 is a flowchart of a method 700 of processing a substrate in accordance with at least some embodiments of the present disclosure. For illustrative purposes, the method 700 is described herein using the processing chamber 100 for etching the substrate 103.

At 702, the method 700 comprises measuring impedance at an input of a matching network configured to receive one or more radio frequency (RF) signals and an output of the matching network configured to deliver the one or more RF signals to a processing chamber. For example, in at least some embodiments, at 702, the first sensor 306 can be configured to measure an impedance at the input of the matching network 188 and the second sensor 308 can be configured to measure an impedance at the output of the matching network 188.

Next, at 704, the method 700 comprises, based on the measured impedance tuning at least one capacitor of the matching network to a first target position based on weighted output impedance values measured at pulse states, e.g., of a voltage waveform, and tuning the at least one variable capacitor to a second target position based on weighted input impedance values measured at the pulse states, e.g., of the voltage waveform.

For example, the variable capacitor (e.g., the second motorized capacitor 304) can be tuned based on weighted output impedance values measured at pulse states and weighted input impedance values measured at the pulse states. For example, as noted above, the weighted output impedance values and the weighted input impedance values are calculated using Equation (1). In at least some embodiments, the at least one capacitor can comprise two variable capacitors (e.g., first motorized capacitor 302 and the second motorized capacitor 304. In such embodiments, the at least two variable capacitors can be tuned at the same time or at different times.

In at least some embodiments, such as when the second sensor 308 is not used, the variable capacitor can be tuned based on weighted output impedances that are stored in a look-up table (e.g., in the memory 154) or a circuit model.

In at least some embodiments (e.g., in a single level pulse signal configuration, which comprises RF signals provided by an RF bias power source, RF signals provided by an RF source power, and/or pulsed voltage waveforms) the impedance values used for Equation (1) can be obtained from pulse ON states. Additionally, the first sample time and the second sample time can be the same or different and are based on at least one of a pulse frequency, duty cycle, or a rising edge of a Transistor-Transistor Logic (TTL) synchronization signal.

Similarly, in at least some embodiments (e.g., in a dual level pulse signal configuration, which comprises at least one of RF signals provided by an RF bias power source, RF signals provided by an RF source power, and/or pulsed voltage waveforms) the impedance values used for Equation (1) can be obtained at a high level pulse stage and a low level pulse stage. In such embodiments, the high level pulse stage is taken at a first sample time and the low level pulse stage is taken at a second sample time that is different from the first sample time. Additionally, the first sample time and second sample time are triggered after a delay from a start of a pulse detected when measured voltage of a pulse is equal to or greater than a threshold.

Weighted impedance values can be calculated using Equation (1) and the impedance data obtained for the single level pulse signal configuration, the dual level pulse signal configuration, or a multilevel pulse signal configuration. The calculated weighted impedance values are stored in the memory 154 and automatically accessed by the controller 150 during operation at 704 to tune the first variable capacitor and/or the second variable capacitor to the weighted target impedance values.

While the foregoing is directed to embodiments of the present disclosure, other and further embodiments of the disclosure may be devised without departing from the basic scope thereof.

The invention claimed is:

1. A matching network configured for use with a plasma processing chamber, comprising:
   an input configured to receive one or more radio frequency (RF) signals;
   an output configured to deliver the one or more RF signals to a processing chamber;
   a first sensor operably connected to the input and a second sensor operably connected to the output and configured to measure impedance during operation;
   at least one variable capacitor connected to the first sensor and the second sensor; and
   a controller, based on a measured impedance, configured to tune the at least one variable capacitor of the matching network to a first target position based on weighted output impedance values measured at pulse states and to tune the at least one variable capacitor to a second target position based on weighted input impedance values measured at the pulse states.

2. The matching network of claim 1, wherein the weighted output impedance values and the weighted input impedance values are calculated using equation:

$$Z_w = Z_1 * w + Z_2 * (1-w),$$

where $Z_1$ is measured at a time 1 and a pulse level 1, and $Z_2$ is measured at a time 2 and a pulse level 2, where w is a weight value between 0 and 1.

3. The matching network of claim 1, wherein in a single level pulse signal configuration, which comprises RF signals provided by an RF bias power source, the pulse states correspond to pulsed data points collected to obtain impedances at a first data sample and at second data sample of the pulse.

4. The matching network of claim 3, wherein the first data sample is taken at a first time and second data sample is taken at a second time that is different from the first time, and
   wherein the first time and the second time are based on at least one of a pulse frequency, duty cycle, or a rising edge of a Transistor-Transistor Logic (TTL) synchronization signal.

5. The matching network of claim 1, wherein in a dual level pulse signal configuration, which comprises at least one of RF signals provided by an RF bias power source or RF signals provided by an RF source power, the pulse states correspond to pulsed data points collected to obtain impedances at a high level pulse stage and a low level pulse stage.

6. The matching network of claim 5, wherein the high level pulse stage is taken at a first time and the low level pulse stage is taken at a second time that is different from the first time, and
   wherein the first time and the second time are triggered after a delay from a start of a pulse detected when a measured voltage is equal to or greater than a threshold.

7. The matching network of claim 1, wherein the matching network is connected to an RF bias power source that is operable at a frequency of about 100 kHz, 13.56 MHz, 15 MHz, 60 MHz, 120 MHz or 162 MHz and in at least one of a continuous mode or a pulsed mode, and wherein in the pulsed mode a pulse frequency is from about 100 Hz to about 10 kHz and a duty cycle of about 5% to about 95%.

8. The matching network of claim 1, wherein the matching network is connected to an RF source power that is operable at a frequency of about 13.56 MHz, 60 MHz, 120 MHz, 162 MHz, or 200 MHz and in at least one of a continuous mode or a pulsed mode, and wherein in the pulsed mode a pulse frequency is from about 100 Hz to about 10 kHz and a duty cycle of about 5% to about 95%.

9. The matching network of claim 1, wherein the at least one variable capacitor comprises a series variable capacitor and shunt variable capacitor.

10. A plasma processing chamber, comprising:
a chamber body and a chamber lid;
a RF source power connected to the chamber lid and configured to create a plasma from gases disposed in a processing region of the chamber body;
one or more RF bias power sources configured to sustain a plasma discharge; and
a matching network comprising:
an input configured to receive one or more radio frequency (RF) signals;
an output configured to deliver the one or more RF signals to a processing chamber;
a first sensor operably connected to the input and a second sensor operably connected to the output and configured to measure impedance during operation;
at least one variable capacitor connected to the first sensor and the second sensor; and
a controller, based on a measured impedance, configured to tune the at least one variable capacitor of the matching network to a first target position based on weighted output impedance values measured at pulse states and to tune the at least one variable capacitor to a second target position based on weighted input impedance values measured at the pulse states.

11. The plasma processing chamber of claim 10, wherein the weighted output impedance values and the weighted input impedance values are calculated using equation:

$$Z_w = Z_1 * w + Z_2 * (1-w),$$

where $Z_1$ is measured at a time 1 and a pulse level 1, and $Z_2$ is measured at a time 2 and a pulse level 2, where w is a weight value between 0 and 1.

12. The plasma processing chamber of claim 10, wherein in a single level pulse signal configuration, which comprises RF signals provided by an RF bias power source, the pulse states correspond to pulsed data points collected to obtain impedances at a first data sample and at second data sample of the pulse.

13. The plasma processing chamber of claim 12, wherein the first data sample is taken at a first time and second data sample is taken at a second time that is different from the first time, and
wherein the first time and the second time are based on at least one of a pulse frequency, duty cycle, or a rising edge of a Transistor-Transistor Logic (TTL) synchronization signal.

14. The plasma processing chamber of claim 10, wherein in a dual level pulse signal configuration, which comprises at least one of RF signals provided by an RF bias power source or RF signals provided by an RF source power, the pulse states correspond to pulsed data points collected to obtain impedances at a high level pulse stage and a low level pulse stage.

15. The plasma processing chamber of claim 14, wherein the high level pulse stage is taken at a first time and the low level pulse stage is taken at a second time that is different from the first time, and
wherein the first time and the second time are triggered after a delay from a start of a pulse detected when a measured voltage is equal to or greater than a threshold.

16. The plasma processing chamber of claim 10, wherein the matching network is connected to an RF bias power source that is operable at a frequency of about 100 kHz, 13.56 MHz, 15 MHz, 60 MHz, 120 MHz or 162 MHz and in at least one of a continuous mode or a pulsed mode, and wherein in the pulsed mode a pulse frequency is from about 100 Hz to about 10 kHz and a duty cycle of about 5% to about 95%.

17. The plasma processing chamber of claim 10, wherein the matching network is connected to an RF source power that is operable at a frequency of about 13.56 MHz, 60 MHz, 120 MHz, 162 MHz, or 200 MHz and in at least one of a continuous mode or a pulsed mode, and wherein in the pulsed mode a pulse frequency is from about 100 Hz to about 10 kHz and a duty cycle of about 5% to about 95%.

18. The plasma processing chamber of claim 10, wherein the at least one variable capacitor comprises a series variable capacitor and shunt variable capacitor.

19. A method for processing a substrate, comprising:
measuring impedance at an input of a matching network configured to receive one or more radio frequency (RF) signals and an output of the matching network configured to deliver the one or more rf signals to a processing chamber; and
based on the measured impedance tuning at least one variable capacitor of the matching network to a first target position based on weighted output impedance values measured at pulse states and tuning the at least one variable capacitor to a second target position based on weighted input impedance values measured at the pulse states.

20. The method of claim 19, wherein the weighted output impedance values and the weighted input impedance values are calculated using equation:

$$Z_w = Z_1 * w + Z_2 * (1-w),$$

where $Z_1$ is measured at a time 1 and a pulse level 1, and $Z_2$ is measured at a time 2 and a pulse level 2, where w is a weight value between 0 and 1.

* * * * *